(12) United States Patent
Singh et al.

(10) Patent No.: US 11,456,384 B2
(45) Date of Patent: Sep. 27, 2022

(54) FIN-BASED LATERALLY DIFFUSED STRUCTURE HAVING A GATE WITH TWO ADJACENT METAL LAYERS AND METHOD FOR MANUFACTURING THE SAME

(71) Applicant: GLOBALFOUNDRIES U.S. Inc., Santa Clara, CA (US)

(72) Inventors: Jagar Singh, Clifton Park, NY (US); Sudarshan Narayanan, San Jose, CA (US); Wang Zheng, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 16/921,068

(22) Filed: Jul. 6, 2020

(65) Prior Publication Data
US 2022/0005952 A1 Jan. 6, 2022

(51) Int. Cl.
*H01L 29/78* (2006.01)
*H01L 29/66* (2006.01)
(Continued)

(52) U.S. Cl.
CPC ...... *H01L 29/7851* (2013.01); *H01L 29/0653* (2013.01); *H01L 29/402* (2013.01);
(Continued)

(58) Field of Classification Search
CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858;
(Continued)

(56) References Cited

U.S. PATENT DOCUMENTS 6,586,808 B1 7/2003 Xiang et al.
9,219,147 B2 12/2015 Toh et al.
(Continued)

OTHER PUBLICATIONS

H.-J. Lee et al., "Implementation of High Power RF Devices with Hybrid Workfunction and Oxide Thickness in 22nm Low-Power FinFET Technology," IEEE, 2019, pp. 25.4.1-25.4.1.

*Primary Examiner* — Younes Boulghassoul
(74) *Attorney, Agent, or Firm* — Anthony Canale; Hoffman Warnick LLC

(57) ABSTRACT

A structure includes a semiconductor fin; a first source/drain region and a second source/drain region in the semiconductor fin; a first doping region about the first source/drain region, defining a channel region in the semiconductor fin; and a second doping region about the second source/drain region, defining a drain extension in the semiconductor fin. A gate structure is over the channel region and the drain extension. The gate structure includes a gate dielectric layer, a first metal layer adjacent a second metal layer over the gate dielectric layer, and a contiguous gate conductor over the first metal layer and the second metal layer. One of the metal layers is over the channel region and the other is over the drain extension. The metal layers may have different thicknesses and/or work functions, to improve transconductance and RF performance of an LDMOS FinFET including the structure.

17 Claims, 6 Drawing Sheets

(51) Int. Cl.
*H01L 29/423* (2006.01)
*H01L 29/06* (2006.01)
*H01L 29/40* (2006.01)
*H01L 29/49* (2006.01)

(52) U.S. Cl.
CPC .. *H01L 29/42368* (2013.01); *H01L 29/42376* (2013.01); *H01L 29/4983* (2013.01); *H01L 29/66681* (2013.01); *H01L 29/66795* (2013.01); *H01L 29/7816* (2013.01)

(58) Field of Classification Search
CPC ... H01L 2924/13067; H01L 29/66681–66704; H01L 29/7816–7826; H01L 29/7835; H01L 29/66659; H01L 29/1095; H01L 29/42376; H01L 29/42384; H01L 21/28114; H01L 21/823456; H01L 21/82385; H01L 29/42368; H01L 21/823437; H01L 21/823828; H01L 29/0649; H01L 29/0653; H01L 29/6681; H01L 21/823878; H01L 21/76224–76237
See application file for complete search history.

(56) References Cited

U.S. PATENT DOCUMENTS

| | | | |
|---|---|---|---|
| 9,412,667 | B2 | 8/2016 | Chou et al. |
| 9,853,021 | B1* | 12/2017 | Wang ................... H01L 29/1045 |
| 10,269,917 | B2 | 4/2019 | Chen et al. |
| 10,629,728 | B1* | 4/2020 | Lee ................. H01L 21/823431 |
| 2010/0295125 | A1* | 11/2010 | Ito ..................... H01L 29/42368 257/E29.261 |
| 2014/0021543 | A1* | 1/2014 | Ito .......................... H01L 29/086 257/E29.261 |
| 2016/0035883 | A1* | 2/2016 | Hao .................... H01L 29/7816 438/591 |
| 2016/0190269 | A1 | 6/2016 | Brown et al. |
| 2016/0225895 | A1* | 8/2016 | He ...................... H01L 29/7816 |
| 2017/0229570 | A1* | 8/2017 | Cheng ................. H01L 29/7835 |
| 2017/0345660 | A1* | 11/2017 | Li ........................ H01L 29/7835 |
| 2017/0352653 | A1* | 12/2017 | Li ........................ H01L 27/0924 |
| 2017/0365602 | A1* | 12/2017 | Zhou ................. H01L 29/66681 |
| 2018/0061981 | A1* | 3/2018 | Zhou ..................... H01L 29/785 |
| 2019/0131406 | A1* | 5/2019 | Ciavatti ............ H01L 21/76224 |
| 2021/0126126 | A1* | 4/2021 | Singh ................ H01L 29/66795 |

* cited by examiner

FIN-BASED LATERALLY DIFFUSED STRUCTURE HAVING A GATE WITH TWO ADJACENT METAL LAYERS AND METHOD FOR MANUFACTURING THE SAME

BACKGROUND

The present disclosure relates to radio frequency (RF) devices, and more specifically, to a FinFET structure with two adjacent metal layers in the gate structure. The metal layers may have different thicknesses and/or work functions.

Radio frequency (RF) devices employ laterally diffused metal-oxide semiconductors (LDMOS) devices. Transconductance (Gm) is the ratio of the change in current at the output terminal to the change in the voltage at the input terminal of an active device. Transconductance improvements in LDMOS devices will improve RF performance.

SUMMARY

An aspect of the disclosure is directed to a structure, comprising: a semiconductor fin; a first source/drain region and a second source/drain region in the semiconductor fin; a first doping region about the first source/drain region, defining a channel region in the semiconductor fin; a second doping region about the second source/drain region, defining a drain extension in the semiconductor fin; and a gate structure over the channel region and the drain extension, the gate structure including: a gate dielectric layer, a first metal layer adjacent a second metal layer over the gate dielectric layer, wherein the first metal layer and the second metal layer have different thicknesses, and a contiguous gate conductor over the first metal layer and the second metal layer.

Another aspect of the disclosure includes a laterally-diffused metal-oxide semiconductor (LDMOS) device, comprising: a first source/drain region and a second source/drain region in a semiconductor fin; a trench isolation between the first and second source/drain regions in the semiconductor fin; a first doping region about the first source/drain region, the first doping region defining a channel region in the semiconductor fin; a second doping region about the second source/drain region, the second doping region defining a drain extension in the semiconductor fin; and a gate structure over the channel region and the drain extension, the gate structure including: a gate dielectric layer, a first metal layer adjacent a second metal layer over the gate dielectric layer, wherein the first metal layer and the second metal layer have different thicknesses, and a contiguous gate conductor over the first metal layer and the second metal layer.

Another aspect of the disclosure relates to a method, comprising: forming a first doping region about a first source/drain region in a semiconductor fin, and a second doping region about a second source/drain region in the semiconductor fin, the first doping region defining a channel region in the semiconductor fin, the second doping region defining a drain extension in the semiconductor fin; and forming a gate dielectric layer over the channel region and the drain extension; forming a first metal layer adjacent a second metal layer over the gate dielectric layer wherein the first metal layer and the second metal layer have different thicknesses; and forming a contiguous gate conductor over the first metal layer and the second metal layer.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
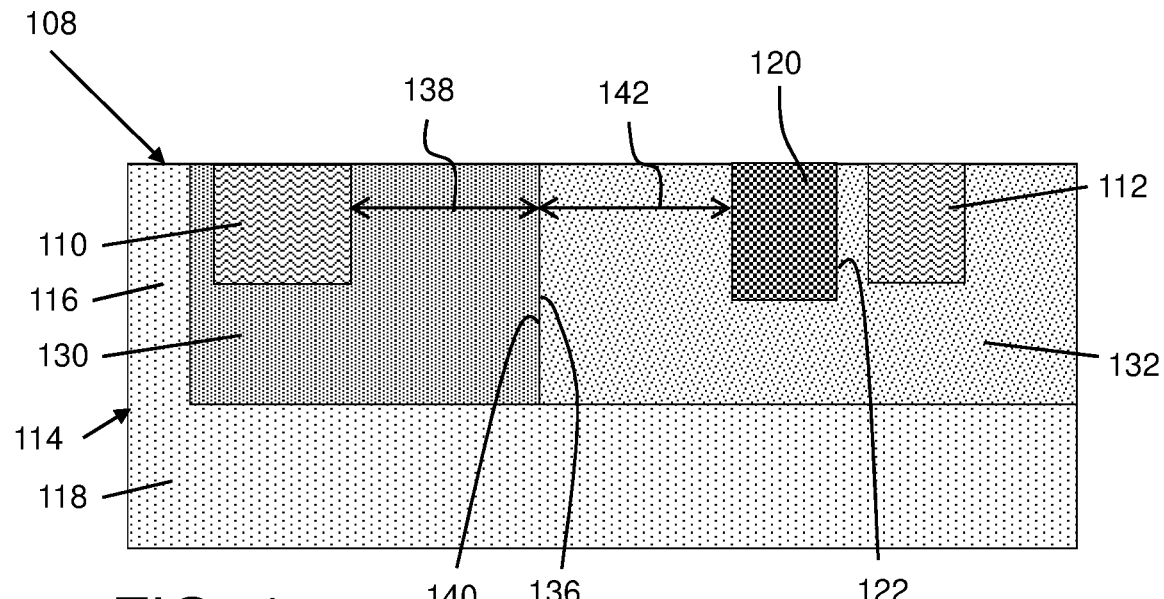
FIG. 1 shows a cross-sectional view of a preliminary structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a structure for use in, for example, a fin-type field effect transistor (FinFET). The structure may be used in laterally-diffused metal-oxide semiconductor (LDMOS) device having advantage relative to radio frequency (RF) applications. The structure includes a semiconductor fin; a first source/drain region and a second source/drain region in the semiconductor fin; a first doping region about the first source/drain region, defining a channel region in the semiconductor fin; and a second doping region about the second source/drain region, defining a drain extension in the semiconductor fin. A gate structure is over the channel region and the drain extension. The gate structure includes a gate dielectric layer, a first metal layer adjacent a second metal layer over the gate dielectric layer, and a contiguous gate conductor over the first metal layer and the second metal layer. One of the metal layers is over the channel region and the other is over the drain extension. The metal layers may have different thicknesses and/or work functions, to improve transconductance and RF performance of an LDMOS FinFET that includes the structure.

FIGS. 1-11 are cross-sectional views of a method to form a structure 100 (FIGS. 8-11) according to various embodiments of the disclosure. For purposes of description, structure 100 may be implemented as a FinFET 102 (FIGS. 8-11) in the form of a LDMOS device 104 (FIGS. 8-11), but it is emphasized that it can also be applied in other types of MOS devices.

FIG. 1 shows a cross-sectional view of forming a preliminary structure 108, including forming a first doping region 130 about a first source/drain region 110 in a semiconductor fin 116, and a second doping region 132 about a second source/drain region 112 in semiconductor fin 116. Semiconductor fin 116 may be part of a semiconductor body 114 that includes semiconductor fin 116 over a (bulk) semiconductor substrate 118. Semiconductor body 114 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained.

Semiconductor substrate 118 may include a dopant. In one embodiment, the dopant may include a p-type dopant, which may include but is not limited to: boron (B), indium (In) and gallium (Ga). P-type dopants are elements introduced to semiconductor to generate a free hole by "accepting" electron from semiconductor atom and "releasing" the hole at the same time. The dopant may be introduced to semiconductor substrate 118 in any now known or later developed fashion, e.g., in-situ doping during formation, or ion implanting. Usually in doping, a dopant, a dosage and an energy level are specified and/or a resulting doping level may be specified. A dosage may be specified in the number of atoms per square centimeter ($cm^2$) and an energy level (specified in keV, kilo-electron-volts), resulting in a doping level (concentration in the substrate) of a number of atoms per cubic centimeter ($cm^3$). The number of atoms is commonly specified in exponential notation, where a number like "3E15" means 3 times 10 to the 15th power, or a "3" followed by 15 zeroes (3,000,000,000,000,000). An example of doping is implanting with B (boron) with a dosage of between about 1E12 and 1E13 atoms/$cm^2$, and an energy of about 40 to 80 keV to produce a dopant concentration of between 1E17 and 1E18 atoms/$cm^3$.

Preliminary structure 108 includes first source/drain region 110 and second source/drain region 112 in semiconductor fin 116. Source/drain regions 110, 112 may be formed using any now known or later developed semiconductor fabrication technique. For example, source/drain regions 110, 112 may be formed by mask-directed doping by ion implantation followed by an anneal to drive in the dopants. Source/drain regions 110, 112 may be doped with an n-type dopant. N-type dopants may include but are not limited to: phosphorous (P), arsenic (As), or antimony (Sb). N-type is an element introduced to semiconductor to generate free electrons by "donating" electrons to the semiconductor.

Forming preliminary structure 108 may also include forming a trench isolation 120 between first and second source/drain regions 110, 112 in semiconductor body 114, i.e., where structure 100 is part of LDMOS device 104. Trench isolation 120 may take any form of an isolating structure or material, but typically includes a shallow trench isolation (STI). Trench isolation 120 may be formed using any now known or later developed semiconductor fabrication technique. Generally, a trench 122 is etched into semiconductor fin 116, and filled with an insulating material such as oxide, to isolate one region of semiconductor body 114 from an adjacent region of the body. Trench isolation 120 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPS G), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Preliminary structure 108 formation also includes forming first doping region 130 about first source/drain region 110. First doping region 130 may take the form of a p-type doped well, (hereafter "p-well") 130. The p-type dopant may be the same as semiconductor body 114, but with a higher dopant concentration. P-well 130 may be formed using any now known or later developed semiconductor fabrication technique, e.g., mask-directed ion implantation prior to formation of first source/drain region 110. Structure 100 also includes a second doping region 132 about second source/drain region 112. Trench isolation 120 is within second doping region 132. Second doping region 132 may be between second source/drain region 112 and trench isolation 120, although this is not necessary in all cases. Second doping region 132 may take the form of an n-type doped well, or n-well (hereafter "n-well") 132. The n-type dopant may be the same as source/drain regions 110, 112, but with a lower dopant concentration. N-well 132 may be formed using any now known or later developed semiconductor fabrication technique, e.g., mask-directed ion implantation prior to formation of second source/drain region 112. As understood in the field, a space between first source/drain region 110 and an edge 136 of p-well 130 defines a channel region 138 of the device; and a space between trench isolation 120 and edge 140 of n-well 132 defines a drain extension 142. While edges 136, 140 are shown as co-linear, that is not necessary in all instances.

Figure 2:
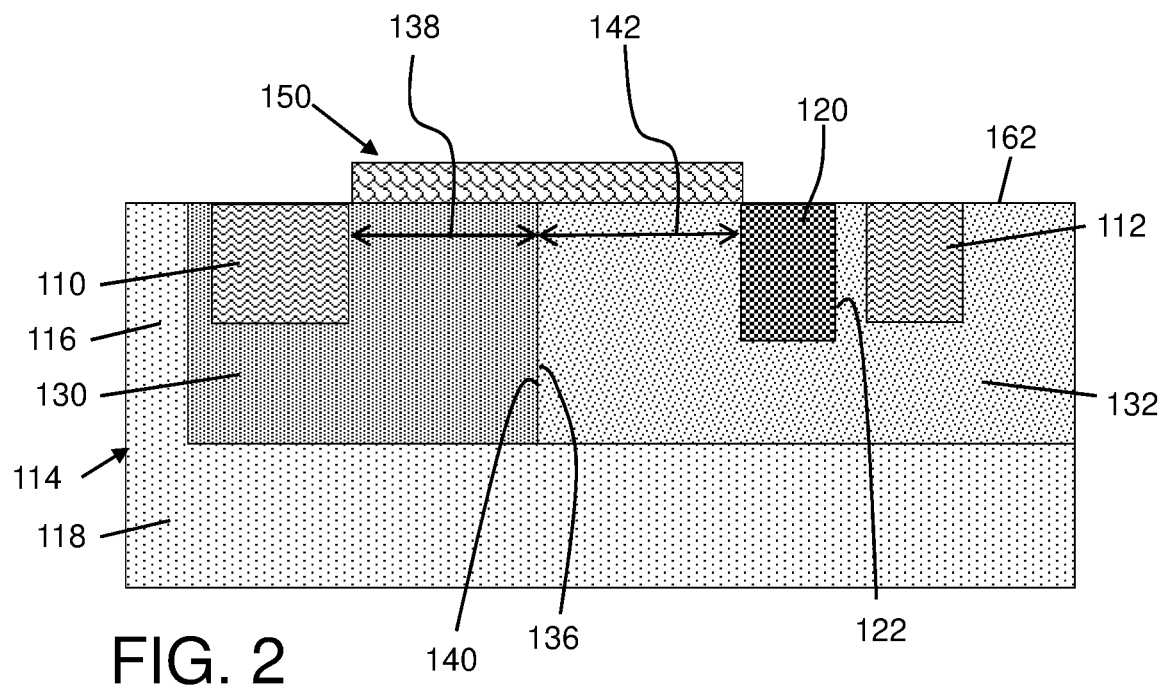
FIG. 2 shows a cross-sectional view of forming a gate dielectric layer having a uniform thickness, according to embodiments of the disclosure.
Figure 3:
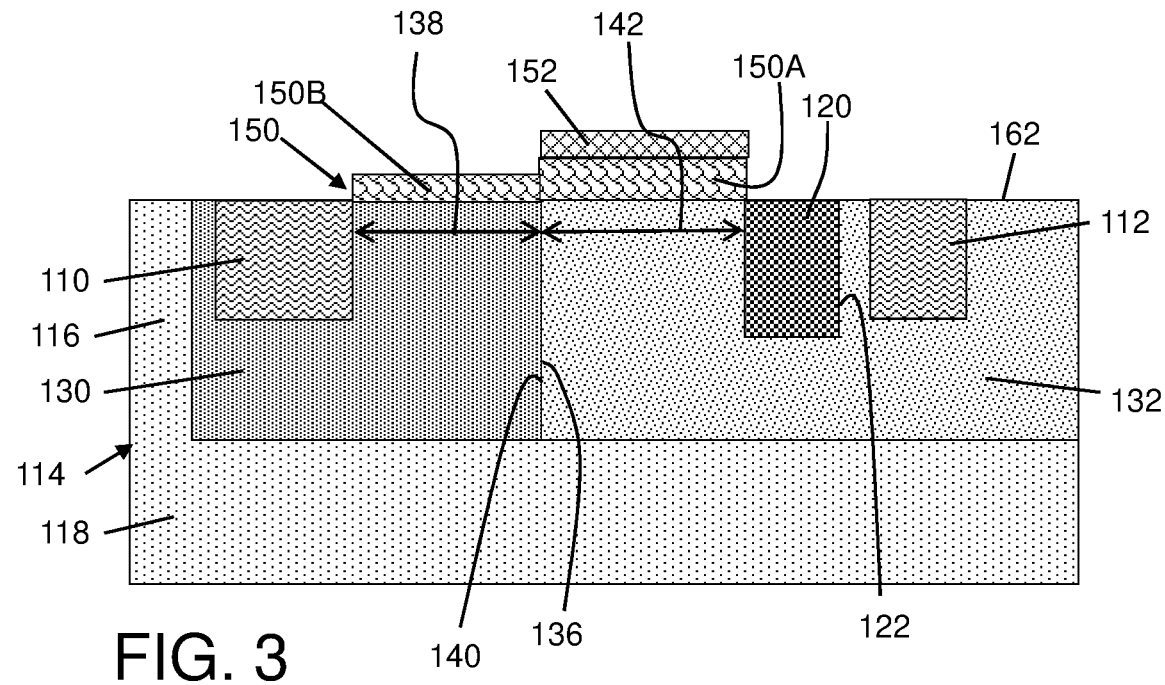
FIG. 3 shows a cross-sectional view of forming a gate dielectric layer having different thicknesses over a channel region and a drain extension, according to embodiments of the disclosure.

FIGS. 2-3 show cross-sectional views of forming a gate dielectric layer 150 over channel region 138 and drain extension 142. Gate dielectric layer 150 may include may include gate dielectric including but not limited to: hafnium silicate (HfSiO), hafnium oxide (HfO$_2$), zirconium silicate (ZrSiO$_x$), zirconium oxide (ZrO$_2$), silicon oxide (SiO$_2$), silicon nitride (Si$_3$N$_4$), silicon oxynitride (SiON), high-k material or any combination of these materials. Gate dielectric layer 150 may be formed using any now known or later developed semiconductor fabrication technique, e.g., deposition. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. In one example, tetraethyl orthosilicate, Si(OC$_2$H$_5$)$_4$ (TEOS) based ALD may be used to form silicon oxide (SiO$_2$).

In one embodiment, as shown in FIG. 2, forming gate dielectric layer 150 includes forming the gate dielectric layer with a uniform thickness over channel region 138 and drain extension 142. The uniform thickness may be thinner than conventionally used. In another embodiment, shown in FIG. 3, gate dielectric layer 150 is thicker over drain extension 142 than over channel region 138. That is, gate dielectric layer 150 may have a first, thicker portion 150A over drain extension 142 and a second, thinner portion 150B over channel region 138. A thinner gate dielectric layer over channel region 138 improve the gate control and hence improves transconductance and performance, and a thicker gate dielectric layer over drain extension 142 reduces hot carrier injection (HCI). HCI refers to a situation where an electron or a "hole" gains sufficient energy to overcome a barrier required to break an interfacial state. When charge carriers become trapped in gate dielectric layer 150, it can change the switching characteristics of the device. The different thickness portions 150A, 150B may be formed using any now known or later developed technique. For example, both portions 150A, 150B may be deposited, then a mask (not shown) may be formed over thinner portion 150B, and further depositing performed to create thicker portion 150A. In the example shown, gate dielectric layer 150 may be deposited having the thickness of first, thicker portion 150A, a mask 152 may then be formed over an area of first, thicker portion 150A, and an etching carried out to form second, thinner portion 150B. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases, which approach the wafer approximately from one direction, and therefore this process is highly anisotropic. Reactive-ion etching (RIE) operates under conditions intermediate between sputter and plasma etching and may be used to produce deep, narrow features, such as STI trenches. Here, a RIE may be used to thin second portion 150B.

Figure 4:
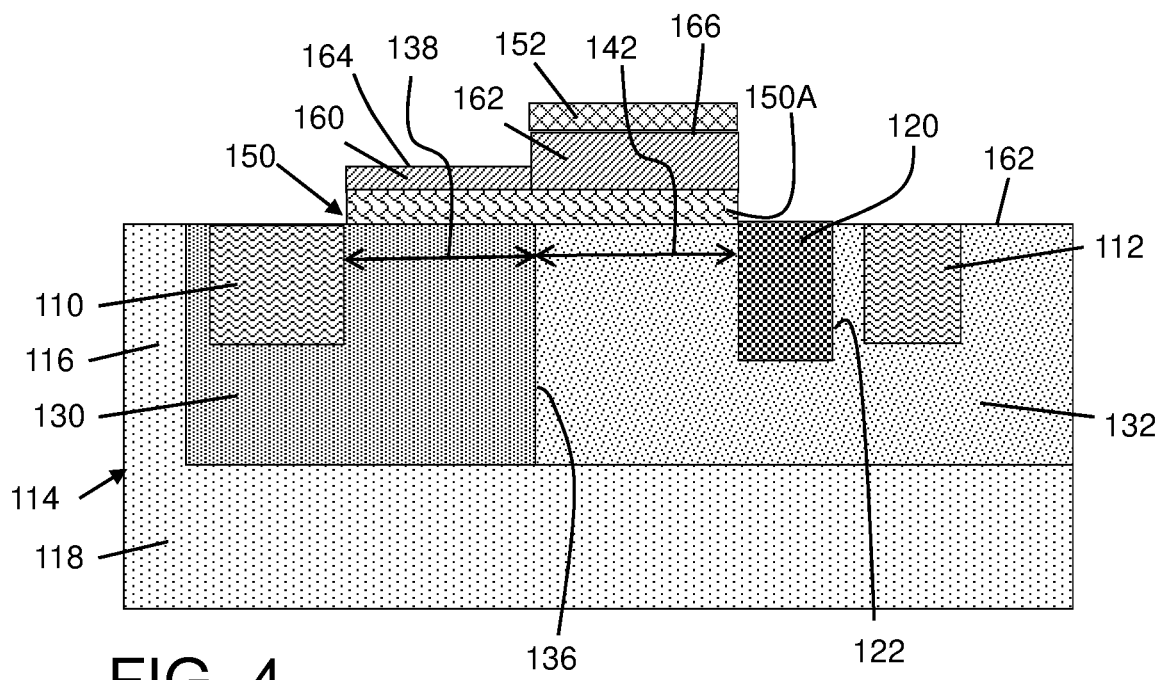
FIG. 4 shows a cross-sectional view of forming first and second metal layers for a gate structure, according to embodiments of the disclosure.
Figure 5:
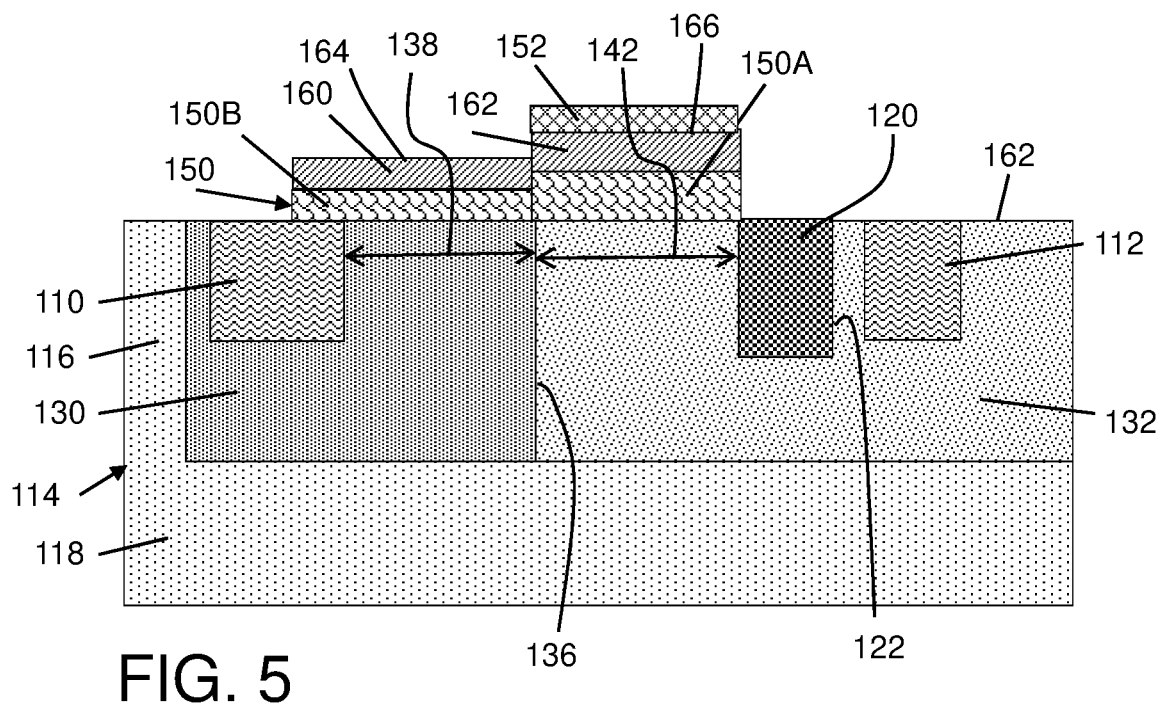
FIG. 5 shows a cross-sectional view of forming first and second metal layers for a gate structure, according to embodiments of the disclosure.
Figure 6:
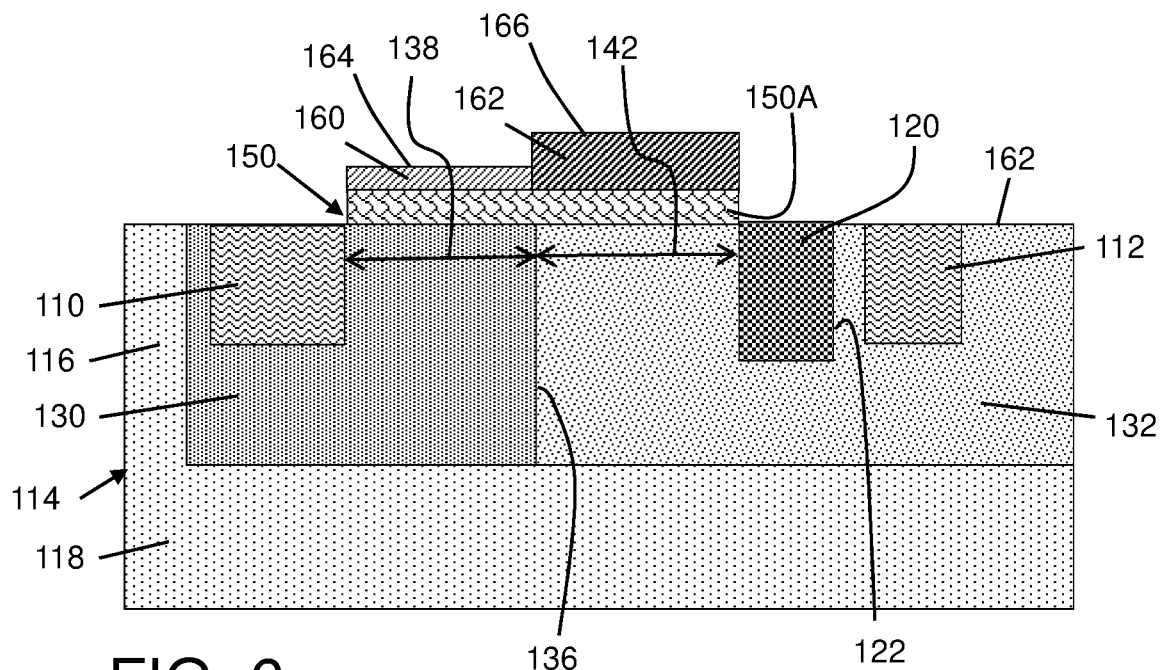
FIG. 6 shows a cross-sectional view of forming first and second metal layers for a gate structure, according to embodiments of the disclosure.
Figure 7:
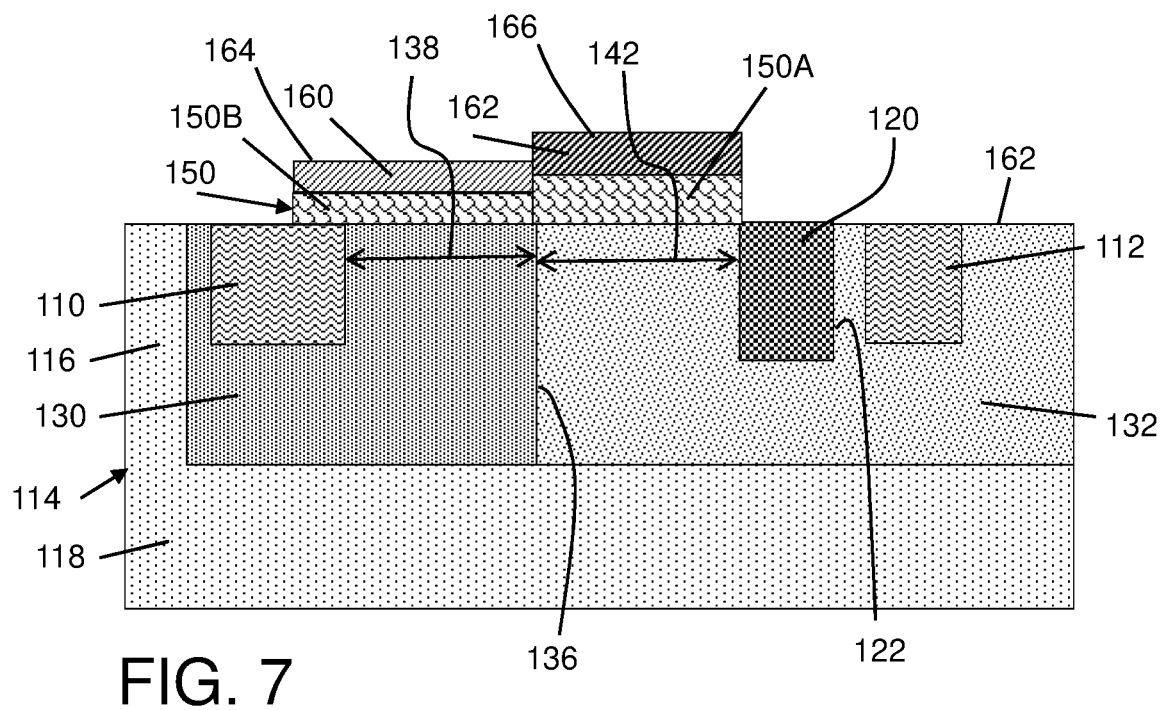
FIG. 7 shows a cross-sectional view of forming first and second metal layers for a gate structure, according to embodiments of the disclosure.

FIGS. 4-7 show cross-sectional views of forming a first metal layer 160 adjacent a second metal layer 162 over gate dielectric layer 150. FIGS. 4 and 6 show forming the layers over the FIG. 2 embodiment with uniform thickness gate dielectric layer 150, and FIGS. 5 and 7 show forming the layers over the FIG. 3 embodiment with gate dielectric layer portions 150A, 150B with different thicknesses. Metal layers 160, 162 may have different work functions to improve the performance of the particular FinFET being formed. First metal layer 160 is over channel region 138, and second metal layer 162 is over drain extension 142. The work function is the minimum energy (usually measured in electron volts) needed to remove an electron from a solid to a point immediately outside the solid surface (or energy needed to move an electron from the Fermi energy level into vacuum). Here "immediately" means that the final electron position is far from the surface on the atomic scale but still close to the solid on the macroscopic scale. The magnitude of the work function is usually about a half of the ionization energy of a free atom of the metal. Work function metals for PFET or NFETs include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), and/or combinations thereof. In certain embodiments, metal layers 160, 162 may have different thicknesses to create different work functions and improve transconductance in different areas of the device, e.g., channel region 138 and/or drain extension 142. In this regard, forming first and second metal layers 160, 162 also includes forming the metal layers to have non-coplanar upper surfaces 164, 166.

In certain embodiments, as shown in FIGS. 4 and 5, metal layers 160, 162 may include the same material such as but not limited to titanium nitride. Here, the different, selective thicknesses alone can be used to tune the performance of the device. First and second metal layers 160, 162 may be formed using any now known or later developed technique. For example, both metal layers 160, 162 may be deposited, then a mask (not shown) may be formed over first, thinner metal layer 160. Further depositing may be performed to create second, thicker metal layer 162. In the example shown, metal layer 160, 162 may be deposited having the thickness of first, thicker portion 150A, a mask 152 may then be formed over an area of first, thicker portion 150A, and an etching carried out to form second, thinner portion 150B. The etching may include, for example, a wet etch.

In certain embodiments, as shown in FIGS. 6 and 7, metal layers 160, 162 may include different materials with different work functions, such as but not limited to titanium nitride and tantalum nitride. Here, the different thicknesses and/or the different materials with different work functions provide different transconductances to allow tuning of the performance of the device. First and second metal layers 160, 162 may be formed using any now known or later developed technique. For example, first metal layer 160 may be deposited. Subsequently, a mask (not shown) may be formed thereover and an appropriate etch performed to remove it from an area for second metal layer 162, and then the mask may be removed. Second metal layer 162 may then be deposited. Subsequently, a mask (not shown) may be formed thereover and an appropriate etch performed to remove it from an area over first metal layer 160, and then the mask may be removed. Regardless of how formed, first and second metal layers 160, 162 are immediately adjacent each other, i.e., they contact one another with no intervening structure.

Figure 8:
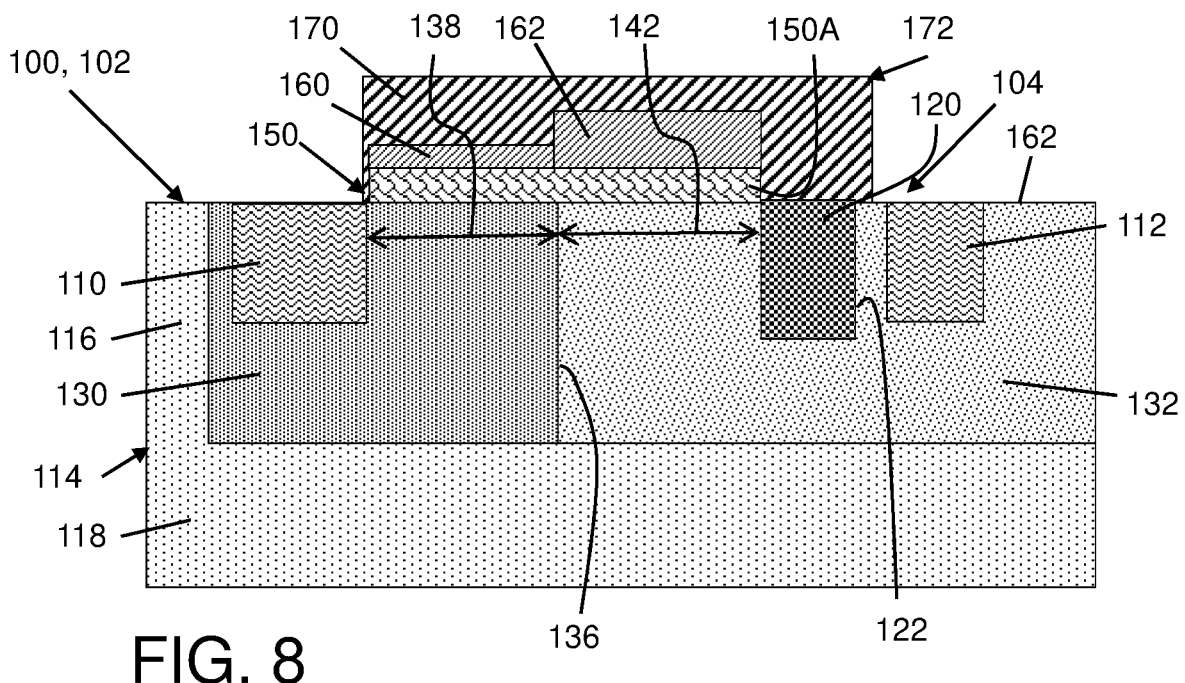
FIG. 8 shows a cross-sectional view of a contiguous gate conductor for a gate structure and a resulting structure, according to embodiments of the disclosure.
Figure 9:
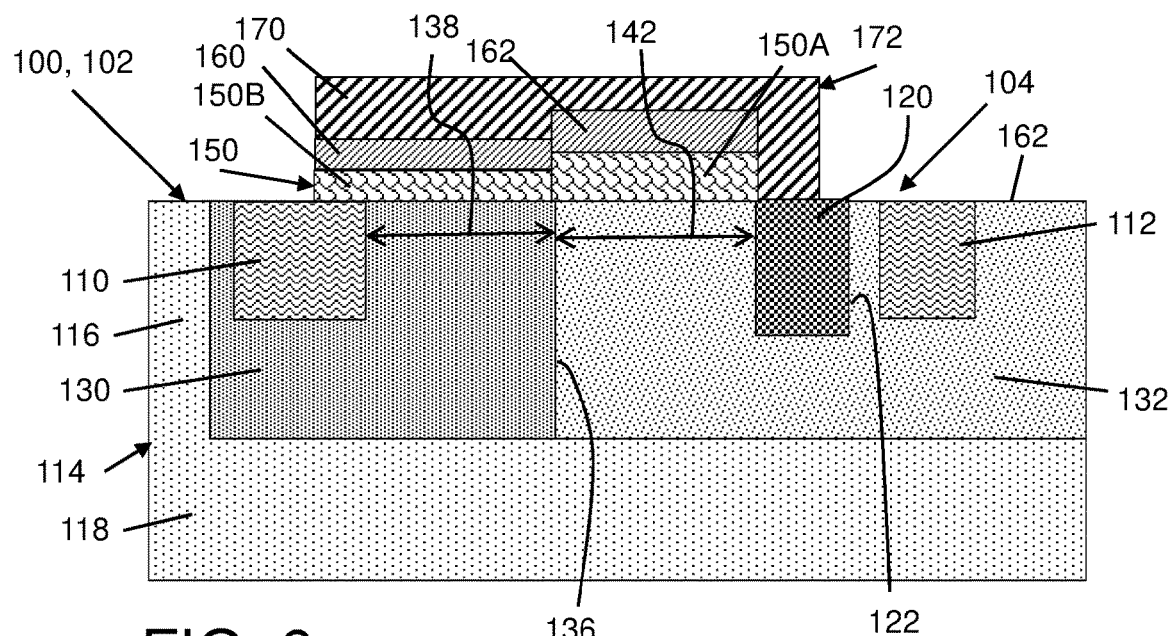
FIG. 9 shows a cross-sectional view of a contiguous gate conductor for a gate structure and a resulting structure, according to embodiments of the disclosure.
Figure 10:
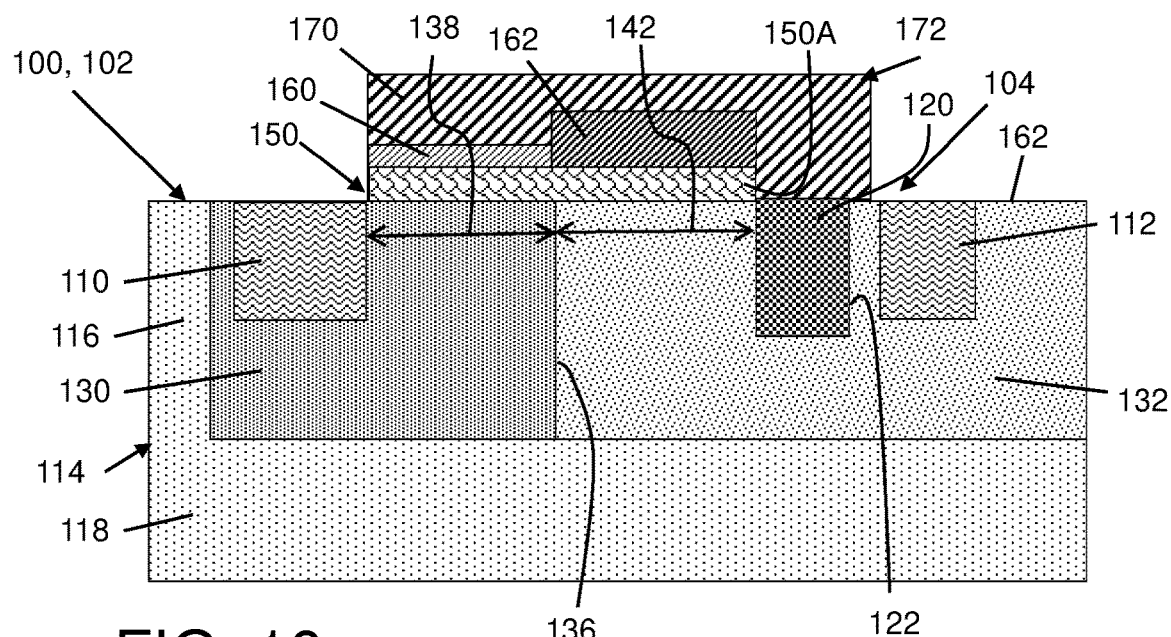
FIG. 10 shows a cross-sectional view of a contiguous gate conductor for a gate structure and a resulting structure, according to embodiments of the disclosure.
Figure 11:
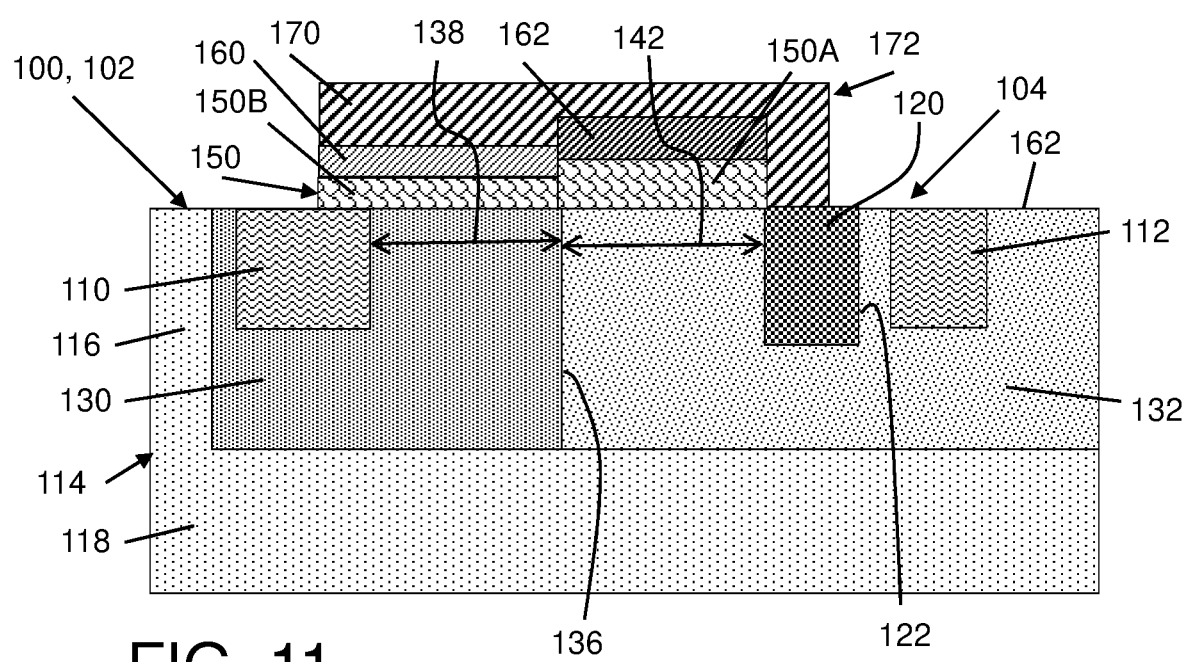
FIG. 11 shows a cross-sectional view of a contiguous gate conductor for a gate structure and a resulting structure, according to embodiments of the disclosure.

FIGS. 8-11 show cross-sectional views of forming a contiguous gate conductor 170 over first metal layer 160 and second metal layer 162, i.e., to complete a gate structure 172. Gate conductor 170 may be any now known or later developed gate conductor material such as but not limited to copper. Gate conductor 170 may be formed using any know known or later developed technique, e.g., depositing, etching, and planarization. FIG. 8 shows forming gate conductor 170 over the FIG. 4 embodiment with uniform thickness gate dielectric layer 150 and same material metal layers 160, 162; FIG. 9 shows forming gate conductor 170 over the FIG. 5 embodiment with different thickness gate dielectric layer 150 and same material metal layers 160, 162; FIG. 10 shows forming gate conductor 170 over the FIG. 6 embodiment with uniform thickness gate dielectric layer 150 and different material metal layers 160, 162; and FIG. 11 shows forming gate conductor 170 over the FIG. 7 embodiment with different thickness gate dielectric layer 150 and different material metal layers 160, 162.

FIGS. 8-11 also show various embodiments of structure 100 in a FinFET 102 (LDMOS device 104). Structure 100 includes semiconductor fin 116, first source/drain region 110 and second source/drain region 112 in semiconductor fin 116. Structure 100 also includes first doping region 130 about first source/drain region 110, defining channel region 138 in semiconductor fin 116; and second doping region 132 about second source/drain region 112, defining drain extension 142 in semiconductor fin 116. Gate structure 172 is over channel region 138 and drain extension 142. Gate structure 172 includes gate dielectric layer 150; first metal layer 160 adjacent second metal layer 162 over gate dielectric layer 150; and contiguous gate conductor 170 over first metal layer 160 and second metal layer 162. First metal layer 160 is over channel region 138, and second metal layer 162 is over drain extension 142. First metal layer 160 and second metal layer 162 have different thicknesses. For example, first metal layer 160 is thinner than second metal layer 162. In FIGS. 8 and 10, gate dielectric layer 150 has a uniform thickness over channel region 138 and drain extension 142. In contrast, in FIGS. 9 and 11, gate dielectric layer 150 is thicker (first portion 150A) over drain extension 142 than over channel region 138 (second portion 150B), i.e., to improve transconductance and HCI. First and second metal layers 160, 162 may have non-coplanar upper surfaces 164, 166 (FIGS. 4-7). In FIGS. 8 and 9, first metal layer 160 and second metal layer 162 are the same material, e.g., titanium nitride. The different thicknesses create different work functions in each area. In contrast, in FIGS. 10 and 11, first metal layer 160 and second metal layer 162 have different materials with different work functions. Structure 100 may also include trench isolation 120 between first and second source/drain regions 110, 112 in semiconductor fin 116.

While embodiments of the disclosure have been disclosed with a particular arrangement of dopant types that create the various doping regions, i.e., for an NFET, it is apparent that the various structures may have the opposite doping types for an opposite type device, i.e., for PFET. That is, semiconductor body 114 may be doped with an n-type dopant, first doping region 130 may be an n-well, second doping region 132 may be a p-well, and third doping region 140/charge trap section 142 may be doped with a p-type dopant.

Embodiments of the disclosure provide a structure 100, FinFET 102 and LDMOS 104 with improved transconductance that finds advantage relative to RF applications. Embodiments of the disclosure can also act to customize threshold voltage (Vt). The metal layers may have different thicknesses and/or work functions that improve the transconductance, and/or customize threshold voltage. In one non-limiting example, first metal layer 160 may have a thickness of 15.6 Angstroms (Å), resulting in a saturation voltage (Vtsat) of 0.28 Volts (V), and second metal layer 162 may have a thickness of 38.9 A, resulting in Vtsat of 0.43V. A thinner gate dielectric layer over channel region 138 and a thinner gate dielectric layer over drain extension 142 may also be selectively used to improve transconductance and reduce HCI.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, a central processor, Internet-of-things (IoT) equipment, and cellular phones.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
    a semiconductor fin;
    a first source/drain region and a second source/drain region in the semiconductor fin;
    a first doping region about the first source/drain region, defining a channel region in the semiconductor fin;
    a second doping region about the second source/drain region, defining a drain extension in the semiconductor fin;
    a gate structure over the channel region and the drain extension, the gate structure including:
        a gate dielectric layer,
        a first metal layer adjacent a second metal layer over the gate dielectric layer, wherein the first metal layer and the second metal layer have different thicknesses, and
        a contiguous gate conductor over the first metal layer and the second metal layer; and
    a trench isolation between the first and second source/drain regions in the semiconductor fin, wherein a sidewall of the trench isolation is substantially aligned with a sidewall of the second metal layer,
    wherein the first metal layer is thinner than the second metal layer.

2. The structure of claim 1, wherein the gate dielectric layer has a uniform thickness over the channel region and the drain extension.

3. The structure of claim 2, wherein the first metal layer and the second metal layer have different materials with different work functions.

4. The structure of claim 3, wherein the first metal layer is over the channel region, and the second metal layer is over the drain extension.

5. The structure of claim 1, wherein the first metal layer and the second metal layer are the same material.

6. The structure of claim 1, wherein the first metal layer and the second metal layer have different materials with different work functions.

7. The structure of claim 1, wherein the first metal layer is over the channel region, and the second metal layer is over the drain extension.

8. The structure of claim 1, wherein the gate dielectric layer is thicker over the drain extension than over the channel region, and the first metal layer and the second metal layer have non-coplanar upper surfaces.

9. A laterally-diffused metal-oxide semiconductor (LDMOS) device, comprising:
    a first source/drain region and a second source/drain region in a semiconductor fin;
    a trench isolation between the first and second source/drain regions in the semiconductor fin;
    a first doping region about the first source/drain region, the first doping region defining a channel region in the semiconductor fin;
    a second doping region about the second source/drain region, the second doping region defining a drain extension in the semiconductor fin; and
    a gate structure over the channel region and the drain extension, the gate structure including:
        a gate dielectric layer,
        a first metal layer adjacent a second metal layer over the gate dielectric layer wherein the first metal layer and the second metal layer have different thicknesses, and
        a contiguous gate conductor over the first metal layer and the second metal layer,
    wherein a sidewall of the trench isolation is substantially aligned with a sidewall of the second metal layer, and an uppermost surface of the trench isolation is substantially coplanar with a surface of the gate dielectric layer under the first metal layer.

10. The LDMOS of claim 9, wherein the gate dielectric layer has a uniform thickness over the channel region and the drain extension, and the first metal layer is thinner than the second metal layer.

11. The LDMOS of claim 10, wherein the first metal layer and the second metal layer have different materials with different work functions.

12. The LDMOS of claim 11, wherein the first metal layer is over the channel region, and the second metal layer is over the drain extension.

13. The LDMOS of claim 9, wherein the gate dielectric layer is thicker over the drain extension than over the channel region, and the first and second metal layers have non-coplanar upper surfaces.

14. A method, comprising:

forming a first doping region about a first source/drain region in a semiconductor fin, and a second doping region about a second source/drain region in the semiconductor fin, the first doping region defining a channel region in the semiconductor fin, the second doping region defining a drain extension in the semiconductor fin;

forming a gate dielectric layer over the channel region and the drain extension;

forming a first metal layer adjacent a second metal layer over the gate dielectric layer wherein the first metal layer and the second metal layer have different thicknesses;

forming a contiguous gate conductor over the first metal layer and the second metal layer; and forming a trench isolation between the first and second source/drain regions in the semiconductor fin, wherein a sidewall of the trench isolation is substantially aligned with a sidewall of the second metal layer, wherein forming the gate dielectric layer includes forming the gate dielectric layer with a uniform thickness over the channel region and the drain extension, and forming the first and second metal layers includes forming the first metal layer thinner than the second metal layer.

15. The method of claim 14, wherein the first and second metal layers have different materials with different work functions.

16. The method of claim 14, wherein forming the first and second metal layers includes forming the first and second metal layers to have non-coplanar upper surfaces.

17. The method of claim 14, wherein the first metal layer is over the channel region, the second metal layer is over the drain extension, and the first metal layer and the second metal layer have different materials with different work functions.

* * * * *